(12) United States Patent
Potempa et al.

(10) Patent No.: US 10,705,128 B2
(45) Date of Patent: Jul. 7, 2020

(54) BATTERY MONITOR CONTROL SYSTEM

(71) Applicant: BTECH Inc., Rockaway, NJ (US)

(72) Inventors: Edward M. Potempa, Pittstown, NJ (US); Allan J. Baum, Jr., Oak Ridge, NJ (US)

(73) Assignee: BTECH Inc., Rockaway, NJ (US)

( * ) Notice: Subject to any disclaimer, the term of this patent is extended or adjusted under 35 U.S.C. 154(b) by 0 days.

(21) Appl. No.: 16/619,975

(22) PCT Filed: May 2, 2019

(86) PCT No.: PCT/US2019/030324
§ 371 (c)(1),
(2) Date: Dec. 6, 2019

(87) PCT Pub. No.: WO2019/221916
PCT Pub. Date: Nov. 21, 2019

(65) Prior Publication Data
US 2020/0132744 A1    Apr. 30, 2020

Related U.S. Application Data

(60) Provisional application No. 62/671,457, filed on May 15, 2018.

(51) Int. Cl.
*H02J 7/02* (2016.01)
*G01R 27/08* (2006.01)
(Continued)

(52) U.S. Cl.
CPC ........... *G01R 27/08* (2013.01); *G01R 31/389* (2019.01); *G01R 31/392* (2019.01); *H02J 7/0016* (2013.01)

(58) Field of Classification Search
CPC ........ G06K 19/0707; H02J 50/80; H02J 7/04; H02J 7/045; H02J 50/12
See application file for complete search history.

(56) References Cited

U.S. PATENT DOCUMENTS

| 6,876,174 B1 | 4/2005 | Samittier Marti et al. |
| 8,648,602 B2 | 2/2014 | van Lammeren |
| (Continued) | | |

FOREIGN PATENT DOCUMENTS

| CN | 201765311 U | 3/2011 |
| CN | 102721928 A | 10/2012 |
| (Continued) | | |

OTHER PUBLICATIONS

International Search Report for PCT/US2019/030324 dated Aug. 20, 2019.
(Continued)

*Primary Examiner* — Alesa Allgood
(74) *Attorney, Agent, or Firm* — Mark Nowotarski

(57) ABSTRACT

A battery monitor control system has a load plate, two or more lead wires connected to two or more busbars in a string of batteries, and a digital signal processor. The load plate has one or more primary switches connected to two or more terminals of the batteries in the string of batteries. The load plate also has a load resistor and a current sensor. The primary switches are turned on and off to produce a ripple current in the string of batteries. The digital signal processor determines the real portion of the complex impedance of at least one of the batteries by analyzing the voltage and current waveform of the ripple current. The primary switches may be turned on and off with a sine wave modulation.

9 Claims, 5 Drawing Sheets

(51) Int. Cl.
*G01R 31/392* (2019.01)
*G01R 31/389* (2019.01)
*H02J 7/00* (2006.01)

(56) References Cited

U.S. PATENT DOCUMENTS

| | | | |
|---|---|---|---|
| 9,368,991 | B2 | 6/2016 | Qahouq |
| 9,735,599 | B2 | 8/2017 | Alessandro et al. |
| 2013/0107597 | A1* | 5/2013 | Mabuchi .............. H02M 7/48 363/124 |
| 2013/0141109 | A1 | 6/2013 | Love et al. |
| 2014/0091783 | A1 | 4/2014 | Cotton et al. |
| 2014/0125284 | A1 | 5/2014 | Qahouq |
| 2017/0074944 | A1 | 3/2017 | Fadel et al. |
| 2018/0059191 | A1 | 3/2018 | Abu Qahouq |

FOREIGN PATENT DOCUMENTS

| | | |
|---|---|---|
| CN | 102879744 A | 1/2013 |
| CN | 106872900 A | 6/2017 |
| CN | 107037363 A | 8/2017 |

OTHER PUBLICATIONS

Written Opinion of the International Searching Authority for PCT/US2019/030324 dated Aug. 20, 2019.
English translation of CN102879744 A, Storage battery online monitoring system and monitoring method thereof, last viewed Aug. 22, 2019.
English translation of CN201765311 U, Battery monitoring device, last viewed Aug. 22, 2019.
Hossain, et al., Battery Impedance Measurement Using Sinusoidal Ripple Current Emulator, Department of Electrical and Computer Engineering, University of Connecitcut, Storrs, CT USA; last viewed Aug. 26, 2019.
Maxim integrated, Tutorial 2031 DC-DC Converter Tutorial dated Nov. 29, 2001, last viewed Apr. 23, 2018.
English translation of CN 102721928A, Storage battery monitor and parameter monitoring method, https://patents.google.com/patent/CN102721928A/en, last viewed Jan. 23, 2018.
English translation of CN 106872900 A, Phase-sensitive detector-based battery internal resistance test circuit, last viewed Jan. 23, 2018.
English translation of CN 107037363 A, Method for measuring battery AC impedance spectroscopy based on state filtering, last viewed Jan. 24, 2019.
Digital Spectrum Incorporated, TMS320C5535 eZdsp™ Technical Reference, Aug. 2011, last viewed Feb. 9, 2018.
Huang et al., IEEE Transactions on Industrial Electronics, vol. 61, No. 11, Nov. 2014, an Online Battery Impedance Measurement Method Using DC-DC Power Converter Control, last viewed Apr. 5, 2018.
Lee et al., Low Temperature Battery Monitoring and Control System—Lithium-Ion Low Temperature Case Study, Senior Project, Electrical Engineering Department California Polytechnic State University, 2014, last viewed Jan. 23, 2018.
Svilainis et al., ResearchGate, Amplitude and phase measurement in acquisition systems, Jan. 2006, last viewed Feb. 6, 2018.
Tairov et al., 2011 Electronics, Robotics and Automotive Mechanics Conference, The Novel Method for Estimating VRLA Battery State of Charge, last viewed Apr. 25, 2018.
Dixit et al., Texas Instruments, Application Report SLAA602—Jun. 2013, 800VA Pure Sine Wave Inverter's Reference Design, last viewed Feb. 9, 2018.
Texas Instruments, Understanding, Measuring, and Reducing Output Voltage Ripple, last viewed Apr. 11, 2018.
Wei et al., energies, MDPI, Practical On-Board Measurement of Lithium Ion Battery Impedance Based on Distributed Voltage and Current Sampling, last viewed Jan. 12, 2018.
En.wikipedia.org, Buck-boost converter, https://en.wikipedia.org/wiki/Buck%E2%80%93boost_converter, last viewed Apr. 11, 2018.
En.wikipedia.org, Insulated-gate bipolar transistor, https://en.wikipedia.org/wiki/Insulated-gate_bipolar_transistor, last viewed Feb. 12, 2018.
En.wikipedia.org, Skin effect, https://en.wikipedia.org/wiki/Skin_effect, last viewed Feb. 9, 2018.
En.wikipedia.org, Transient voltage suppressor, https://en.wikipedia.org/wiki/Transient_voltage_suppressor, last viewed Feb. 12, 2018.
En.wikipedia.org, Pulse-width modulation, https://en.wikipedia.org/wiki/Pulse-width_modulation, last viewed May 7, 2018.
En.wikipedia.org, Electrical impedance, https://en.wikipedia.org/wiki/Electrical_impedance, last viewed May 7, 2018.
En.wikipedia.org, Eletromagnetic induction, https://en.wikipedia.org/wiki/Electromagnetic_induction, last viewed Jan. 17, 2018.
En.wikipedia.org, Flyback diode, https://en.wikipedia.org/wiki/Flyback_diode, last viewed May 7, 2018.
En.wikipedia.org, Lock-in amplifier, https://en.wikipedia.org/wiki/Lock-in_amplifier, last viewed Jan. 23, 2018.

* cited by examiner

United States Patent

BATTERY MONITOR CONTROL SYSTEM

TECHNICAL FIELD

The inventions described herein are in the field of battery monitors.

BACKGROUND ART

There is a long felt need to accurately measure the internal impedance of a battery unit. As used herein, a "battery unit" or "unit" is the smallest part of a battery that can be connected to a battery monitor. A battery unit may be, but is not limited to, one or more of:
  Cell: An individual electrochemical device composed of two electrodes of dissimilar metals (active materials) and an electrolyte. When the electrodes are immersed in an electrolyte, the cell will produce a voltage differential between the electrodes. When connected to electrodes, the cell will produce a current through an external circuit.
  Jar: One or more cells in a battery string manufactured and contained in a single container.
  Monobloc: Two or more separate but electrically connected cells each of which is designed to house an assembly of electrodes, electrolyte, terminals or interconnections and possible separators. The cells in the monobloc can be connected in parallel or in series.

As used herein, a "battery string" is one or more battery units connected in series to furnish an electrical current at a specified total terminal voltage. Multiple strings may be connected in parallel to attain a higher current or energy capacity in a battery system.

Battery units in a battery string may be connected by conductors known as "busbars". As used herein, a bulbar can be any conductor in any form such as a solid bar, a cable or a flexible wire. Busbars may or may not be insulated.

SUMMARY OF INVENTION

The summary of the invention is a guide to understanding the invention. It does not necessarily describe the most generic embodiment of the invention.

FIG. 1 is a drawing of a battery string 100 in combination with a schematic of a battery monitor control system 150. In large battery backup systems, a string of individual battery units 102 are connected in series by one or more busbars (e.g. 104, 106). The busbars are connected to the terminals (e.g. 108, 110) of the battery units. The battery units might be VRLA, flooded lead-acid, nicad, lithium or any other battery technology. Individual unit voltages might be about 2.3 V. Any voltage may be present. String voltages might be 552 V. Any string voltage might be useful. Thus, a string might have 240 units connected in series. Any number of units may be connected in a string. Multiple strings might be connected in parallel to get a desired battery current or energy capacity. The battery strings might be connected to a main load $R_M$ through terminals T+ and T−. The load may be anything that draws current, such as a bank of computer servers. Power may be fed into the battery string from an external source, such as an electric utility grid. Electricity from the utility grid is rectified and provides DC current to the main load through the battery string. This DC current is called a float current. If electricity from the utility is lost, then the battery strings discharge through the main load to provide uninterrupted power. The battery strings provide power until a backup generator, if available, can spin up to speed to provide the current to the main load. The backup generator runs until electricity from the utility is restored.

If any individual unit in a string fails, that can cause other units to fail and potentially lead to catastrophic failure of the string, especially under discharge. It is important, therefore, to continually assess the state of health (SOH) of each individual unit in a string. The SOH of a unit can be deduced from a measurement of the unit's internal impedance. As a unit degrades, the impedance increases.

The impedance in a given unit can be measured by periodically varying a load in parallel to the main load. This can be achieved by opening and closing a switch Q in series with a load resistor $R_L$. This causes a ripple current through the string. The ripple current may be measured by a current sensor A1. Any current sensing technology may be used. The switch and/or load resistor may be mounted on a load plate LP. The load plate can help dissipate heat generated by the switch and/or load resistor. The load plate may be made of a sheet of high conductivity material, such as aluminum or an aluminum alloy. Cooling fins and/or liquid cooling may be supplied to the load plate. A fan may be provided to dissipate heat from the cooling fins.

The voltage across a given unit 102 can be measured by connecting lead wires 118, 112 to the busbars 106, 104 on each side of the unit. The lead wires may be connected to the busbars at attachment points 116, 114 at about the center points of the busbars. The lead wires for all of the units may be collected into one more lead wire bundles 120. The lead wires are then connected to a voltage sensor. The voltage sensor may be a multiplexing voltage sensor that switches between units to measure voltage at each unit for a period of time. The voltage sensor may be part of a digital signal processor (DSP) 122. The current sensor may also be fed into the digital signal processor. Any technology that can process time-varying signals can be used to sense and process the signals from the voltage sensor and current sensor, such as an analog signal processor.

The digital signal processor may open and close the switch Q to create the ripple current. The digital signal processor then analyzes the voltage and current wave forms from each unit to determine the impedance of each unit.

One of the challenges of this technique is that the resistive portion of the internal impedance of each unit may be comparable to the inductive impedance of the busbars for each unit. This problem is compounded by the fact that the amount of inductive impedance in the bulbar for each unit (e.g. $L_{BB1}$, $L_{BB2}$, $L_{BB3}$, $L_{BB4}$ in FIG. 2) varies from unit to unit. This is due to differences in attachment points for the lead wires and different geometries of the different busbars. There may also be inductive coupling (e.g. $L_{LW1}$, $L_{LW2}$, $L_{LW3}$, $L_{LW4}$ in FIG. 2) between the lead wires and the busbars. Thus, there may be a phase shift between the voltage signal across a unit and the current signal for said unit.

The phase shift can be corrected for by processing the voltage signal and current signal in the DSP to determine the complex impedance of a unit. The real portion of the complex impedance for a given unit can then be determined. This real portion of the complex impedance is a measurement of the resistive portion of the internal impedance of the unit. The restive portion of the internal impedance of a unit is a useful measure of the SOH of a unit. An increase in the internal impedance over time indicates a reduced SOH of a unit. Units may be changed out when the internal impedance or the change in internal impedance is greater than a given threshold.

The resistive portion of the unit impedance may also include the resistive portion of the busbar between the attachment points of the lead wires. This allows the system to alarm if a busbar is broken or improperly installed. It does not impact the ability of the system to track changes in unit impedance over time since, absent a break or improper installation, the impedance of the busbar may remain constant over time.

In a first embodiment, the switch Q is turned on and off at a reference frequency, such as about 50 Hz, to generate the ripple current. The DSP can filter out all higher and lower frequency components of the voltage and current signals to get an impedance measurement at the reference frequency. 50 Hz is a suitable reference frequency since it is high enough to filter out the capacitive portion of the internal impedance of a typical unit and low enough so that changes in busbar impedance due to eddy currents is low. It is also offset from the 60 Hz frequency of line voltage in the United States so that inductive pickup of line voltage can be filtered out. In other jurisdictions, such as Europe, where line voltage is regulated to 50 Hz, the reference frequency can be offset to another value, such as 60 Hz. Reference frequencies in the range of 40 Hz to 70 Hz may be suitable.

The load resistor is selected so that the amplitude of the current ripple signal is large enough to generate an amplitude in the unit voltage ripple signal such that accurate measurements of unit impedance can be made. A load resistor that produces a 20-amp amplitude in ripple current or greater is suitable for a stationary VRLA battery.

MODES FOR CARRYING OUT THE INVENTION

The detailed description describes non-limiting exemplary embodiments. Any individual features may be combined with other features as required by different applications for at least the benefits described herein.

Both numbers (e.g. 100) letter (e.g. Q) and letters with subscripts (e.g. $R_L$) are used herein to label elements of the figures.

As used herein, the term "about" means plus or minus 10% of a given value unless specifically indicated otherwise.

Examples provided in the singular imply examples in the plural and vice versa.

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

As used herein, a "computer-based system" comprises an input device for receiving data, an output device for outputting data in tangible form (e.g. printing or displaying on a computer screen), a permanent memory for storing data as well as computer code, and a microprocessor for executing computer code wherein said computer code resident in said permanent memory will physically cause said microprocessor to read-in data via said input device, process said data within said microprocessor and output said processed data via said output device. A digital signal processor is an example of a computer-based system.

As used herein, the term "shaped" means that an item has the overall appearance of a given shape even if there are minor variations from the pure form of said given shape.

As used herein, the term "generally" when referring to a shape means that an ordinary observer will perceive that an object has said shape even if there are minor variations from said shape.

As used herein, relative orientation terms, such as "up", "down", "top", "bottom", "left", "right", "vertical", "horizontal", "distal" and "proximal" are defined with respect to an initial presentation of an object and will continue to refer to the same portion of an object even if the object is subsequently presented with an alternative orientation, unless otherwise noted.

Battery Monitor Control System

Figure 1:
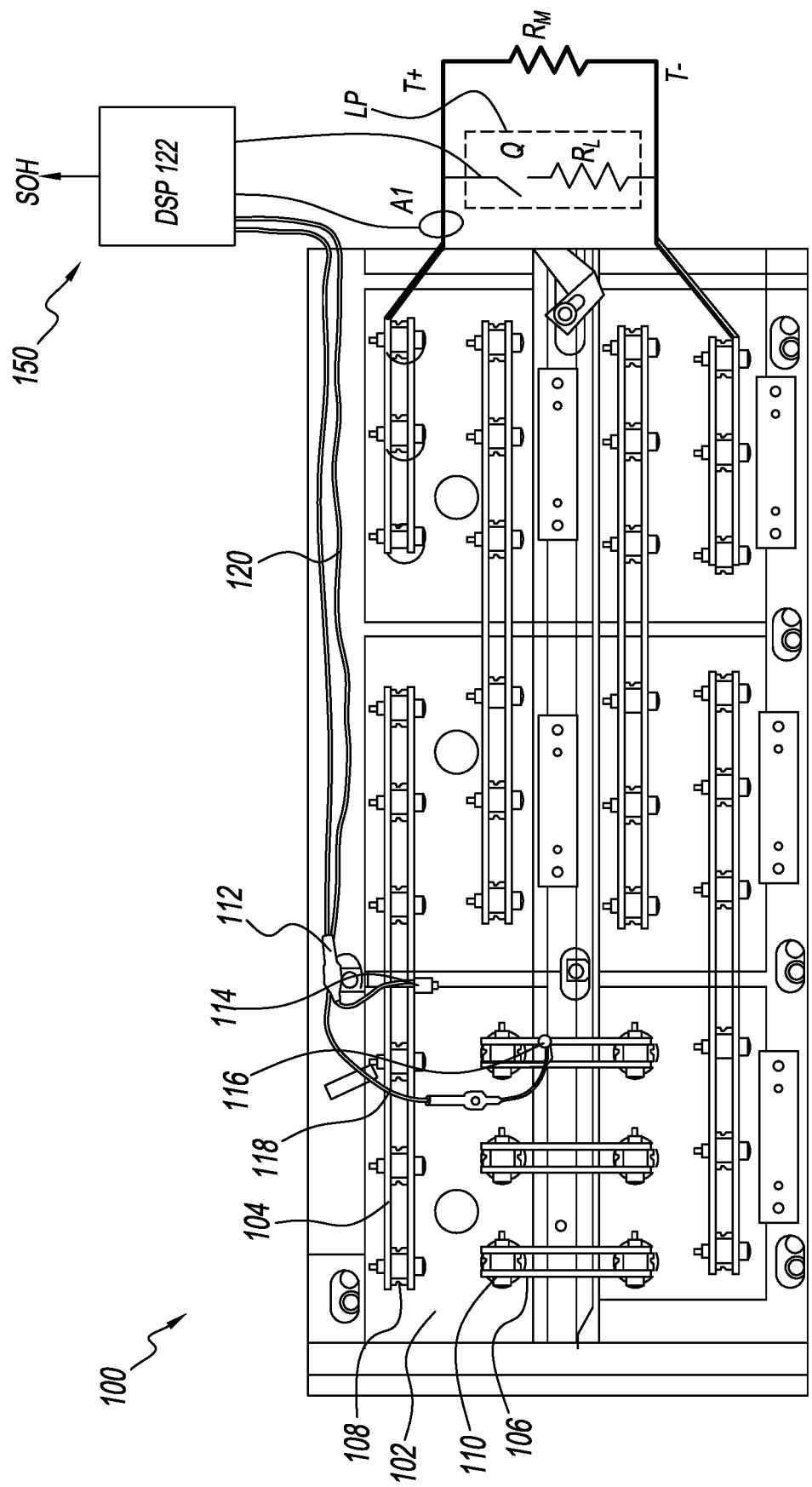
FIG. 1 is a drawing of a battery string in combination with a schematic of a battery monitor control system.
Figure 2:
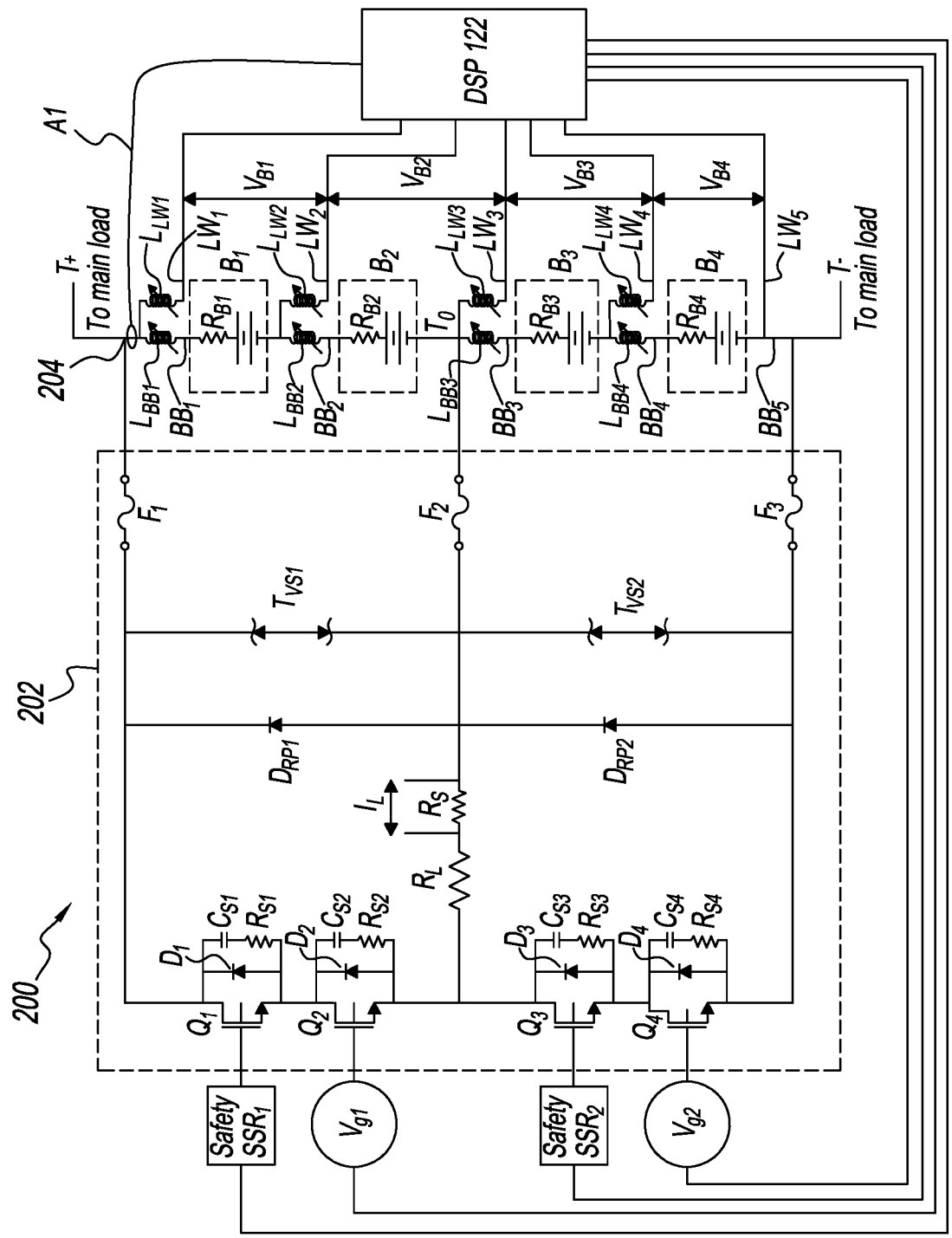
FIG. 2 is a schematic of a battery monitor control system.

FIG. 2 is a schematic of a battery monitor control system 200. The system comprises:
  a) A load plate 202 comprising:
    one or more primary switches (e.g. $Q_2$, $Q_4$) adapted to be connected to two or more terminals (e.g. (T+, $T_o$, T−)) of a string of one or more battery units (e.g. $B_1$, $B_2$, $B_3$, $B_4$) connected in series;
    a load resistor $R_L$ in series with said one or more primary switches; and
    a current sensor (e.g. sensor resistor $R_S$) in series with said one or more primary switches;
  b) two or more lead wires (e.g. $LW_1$, $LW_2$, $LW_3$, $LW_4$, $LW_5$) adapted to be connected to two or more busbars (e.g. $BB_1$, $BB_2$, $BB_3$, $BB_4$, $BB_5$) electrically connecting said battery units in said string;
  c) a digital signal processor 122 adapted to:
    control (e.g. $V_{g1}$, $V_{g2}$) said one or more primary switches to produce a ripple current through said string of battery units, said ripple current having a ripple current wave form comprising a reference frequency;
    measure a ripple voltage wave form (e.g. $V_{B1}$, $V_{B2}$, $V_{B3}$, $V_{B4}$) across each of said battery units via said lead wires;
    measure said ripple current wave form (e.g. $I_L$) from said current sensor;
    determine a real portion (e.g. $R_{B1}$, $R_{B2}$, $R_{B3}$, $R_{B4}$) of a complex impedance of each of said battery units using said measured ripple voltage wave forms and said measured ripple current wave forms; and
    output said real portion of said complex impedance of each of said battery units such that changes in said real portion of said complex impedance of each battery unit can be tracked over time.

The primary switches may be controlled by a pulse width modulated sine wave. As used herein, a "sine wave" also includes a phase shifted sine wave, such as a cosine wave.

The load plate may comprise additional safety and performance elements including:
  one or more safety switches (e.g. $Q_1$, $Q_3$) in series with each of said primary switches, said safety switches being controlled by said DSP (e.g. $SSR_1$, $SSR_2$);

one or more blocking diodes (e.g. $D_{RP1}$, $D_{RP2}$) in parallel with each of said one or more primary switches, said blocking diodes providing protection of the primary and safety switches against the terminals being connected to the battery string with reverse polarity;

one or more back-to-back Zener diode pairs (e.g. $T_{VS1}$, $T_{VS2}$) in parallel with each of said one or more primary switches wherein said Zener diode pairs become conductive at a voltage greater than a safety voltage such that the voltage across said primary switches does not exceed a safety voltage threshold; or one or more fuses (e.g. $F_1$, $F_2$, $F_3$) in series with said primary switches wherein said fuses will open at a safety current such that the current through said primary switches will not exceed a safety current threshold.

Each of said primary switches and safety switches may comprise one or more safety and performance elements including:

an insulated gate bipolar transistors (IGBT)(e.g. $Q_1$, $Q_2$, $Q_3$, $Q_4$);

a freewheeling diode (e.g. $D_1$, $D_2$, $D_3$, $D_4$) in parallel with each of said IGBTs, wherein said freewheeling diodes may be integral to said IGBTs; or an RC snubbing circuit (e.g. $C_{S1}$-$R_{S1}$, $C_{S2}$-$R_{S2}$, $C_{S3}$-$R_{S3}$, $C_{S4}$-$R_{S4}$) in parallel with each of said IGBTs.

The switches used herein are not limited to IGBTs. Any switch, including mechanical or vacuum tubes, may be used.

The system 200 may comprise a current sensor A1 at the positive pole of the battery string, but prior to the junction 204 with the switches. The current sensor A1 can be used in combination with the resistive current sensor $R_s$ to measure the ripple current through battery units $B_3$ and $B_4$ when the primary switch $Q_4$ is switched on and off. If positive current is defined as the current from negative to positive, then the ripple current through units $B_3$ and $B_4$ is equal to the ripple current through Rs plus the ripple current through A1.

Pulse Width Modulation of Ripple Current

Any periodic wave form with a reference frequency can be used to drive the switches (e.g. $Q_2$, $Q_4$) to generate the ripple current. The DSP will filter the ripple current wave form and the ripple voltage wave forms of the individual battery units to determine a complex impedance at the reference frequency. Suitable wave forms include a square wave, a sine wave and a pulse width modulated sine wave.

A square wave has a large fraction of its energy at frequencies above the reference frequency. Thus, excessive power will be dissipated in the load resistor $R_L$. A sine wave has all of its energy at the reference frequency, but the switches will have a large portion of their duty cycle at intermediate current and voltage levels. This can cause excess power to be dissipated in the switches themselves and may cause them to overheat.

A suitable wave form that has reduced power dissipation in both the load resistor and the switches is a pulse width modulated sine wave. More of its power is at the reference frequency than a square wave hence there is less wasted energy in the load resistor. The switches spend less time at intermediate voltage and current levels so the energy dissipated in the switches is reduced.

Figure 3:
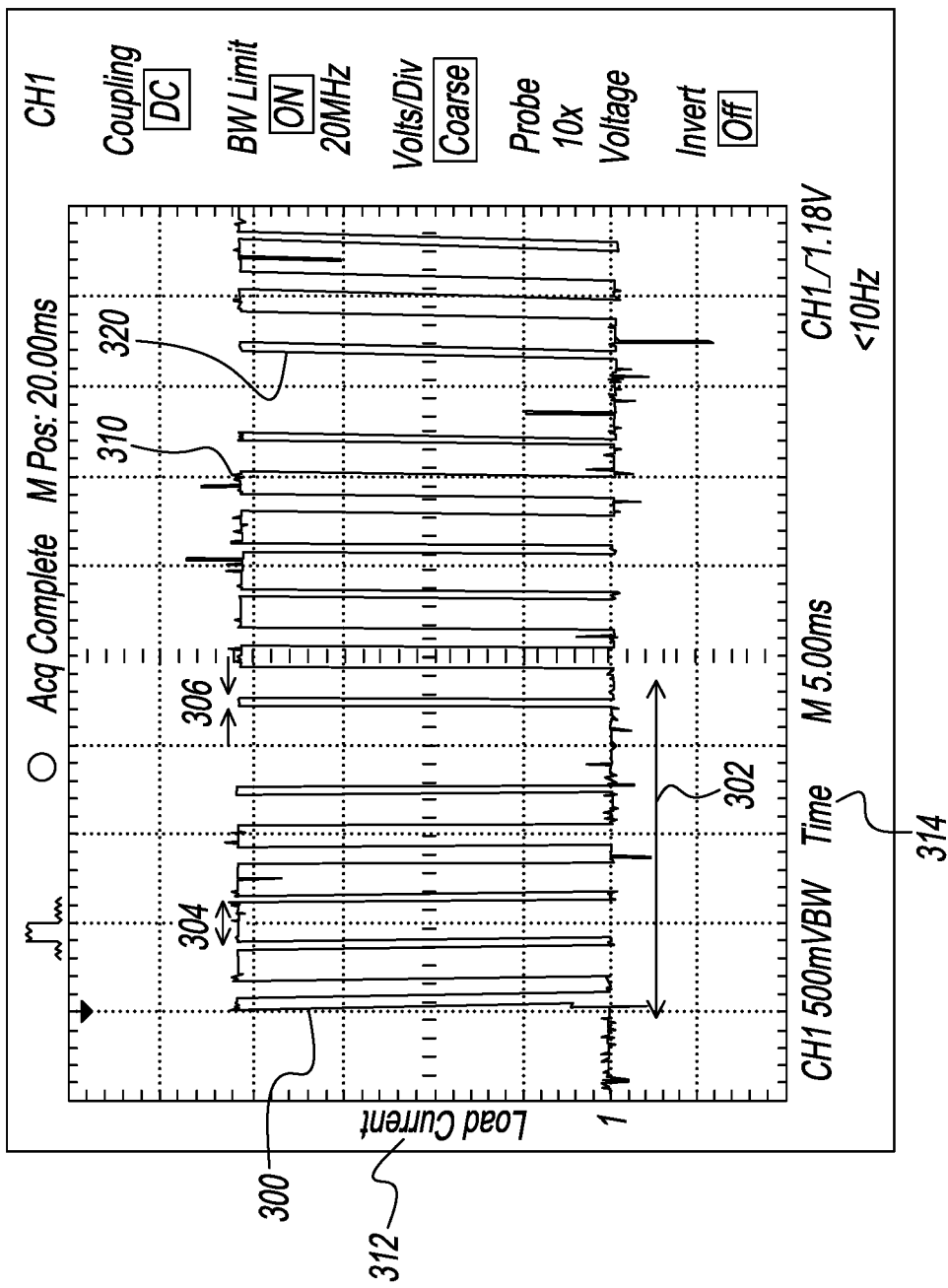
FIG. 3 is an oscilloscope output showing a ripple current wave form.

FIG. 3 is an oscilloscope trace (i.e. wave form) 300 for the load current 312 as indicated by a voltage drop across the current sensing resistor Rs (FIG. 2). The X axis 314 is in units of time with a scale of 5 ms per square. The Y axis 312 is the voltage across the sensing resistor $R_s$ with a scale of 500 my per square. The sensing resistor was 0.1 ohms. Thus, the Y axis scale corresponds to 5 amps per square. The reference period 302 was 20 ms. This corresponds to a reference frequency of 50 Hz. The modulation period 304 was 2.5 ms. This corresponds to a modulation frequency of 400 Hz or 8 times the reference frequency. Modulation frequencies in the range of 4 to 16 times the reference frequency may be suitable. It was discovered that about 8 modulation periods per reference period reduces the high frequency power dissipation in the sensing resistor $R_L$ without unduly increasing the power dissipation in the IGBTs (e.g. $Q_1$, $Q_2$). Higher and lower modulation periods per reference period can be used.

The pulse width modulation can be seen in the varying widths 306 of the pulses. A certain amount of noise 310 can be seen in the trace. The rise time 320 of the current trace is very fast relative to the modulation period.

Figure 4:
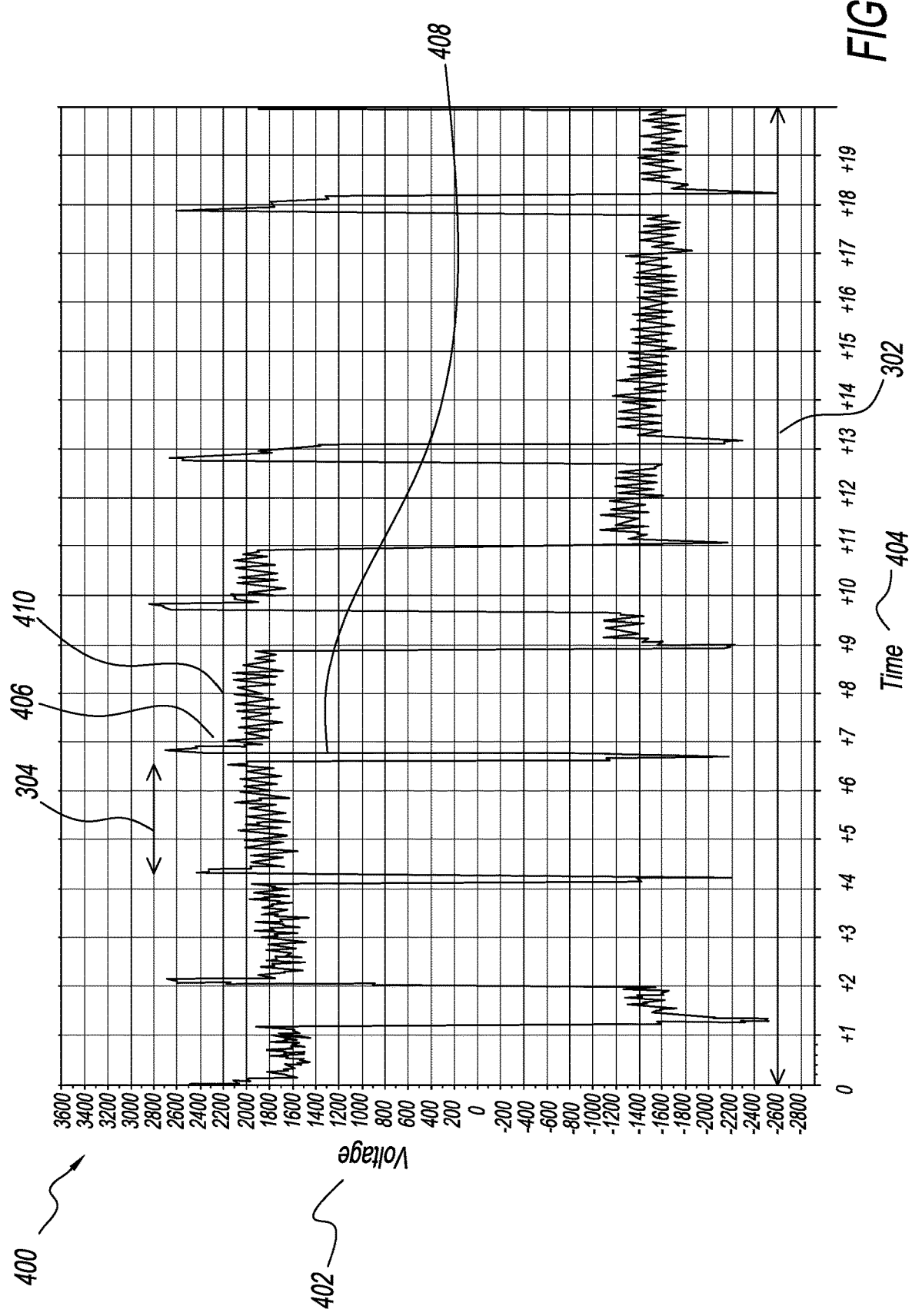
FIG. 4 is a DSP controller output showing a battery ripple voltage wave form.

FIG. 4 shows a voltage trace 400 across one the battery units (e.g. $B_1$) in the string. Voltage 402 is shown on the Y axis as bits from an A/D converter. Each bit corresponds to about 3.6 microvolts. Time 404 is shown on the X axis. The reference period 302 and modulation period 304 can be seen. The effects of the busbar inductance and the inductive coupling between the lead wires and the busbar can be seen in the slower rise time 408 relative to the rise time 320 of the current trace. The inductive coupling can also be seen in the overshoot 406 of the voltage trace. Noise 410 in the signal can also be seen. The slower rise time and overshoot result in an overall phase shift in the voltage trace relative to the current trace. Hence the impedance is a complex number. The DSP can analyze the data using, inter alia, a fast Fourier transform or a phase lock algorithm to filter out the phase shift and give a measurement of the resistive impedance of the battery unit.

The data sampling rate of the wave forms was 48 kHz. This corresponds to about 960 samples per reference period. The DSP analyzed data over about 36 periods of the reference frequency (i.e. 36 reference periods) to give a good signal to noise ratio. Higher sampling rates than 48 kHz and analysis over more reference periods than 36 may be suitable. In this example, the measured battery unit resistive impedance was about 0.6627 milliohms. The phase shift was about –0.6 degrees.

Figure 5:
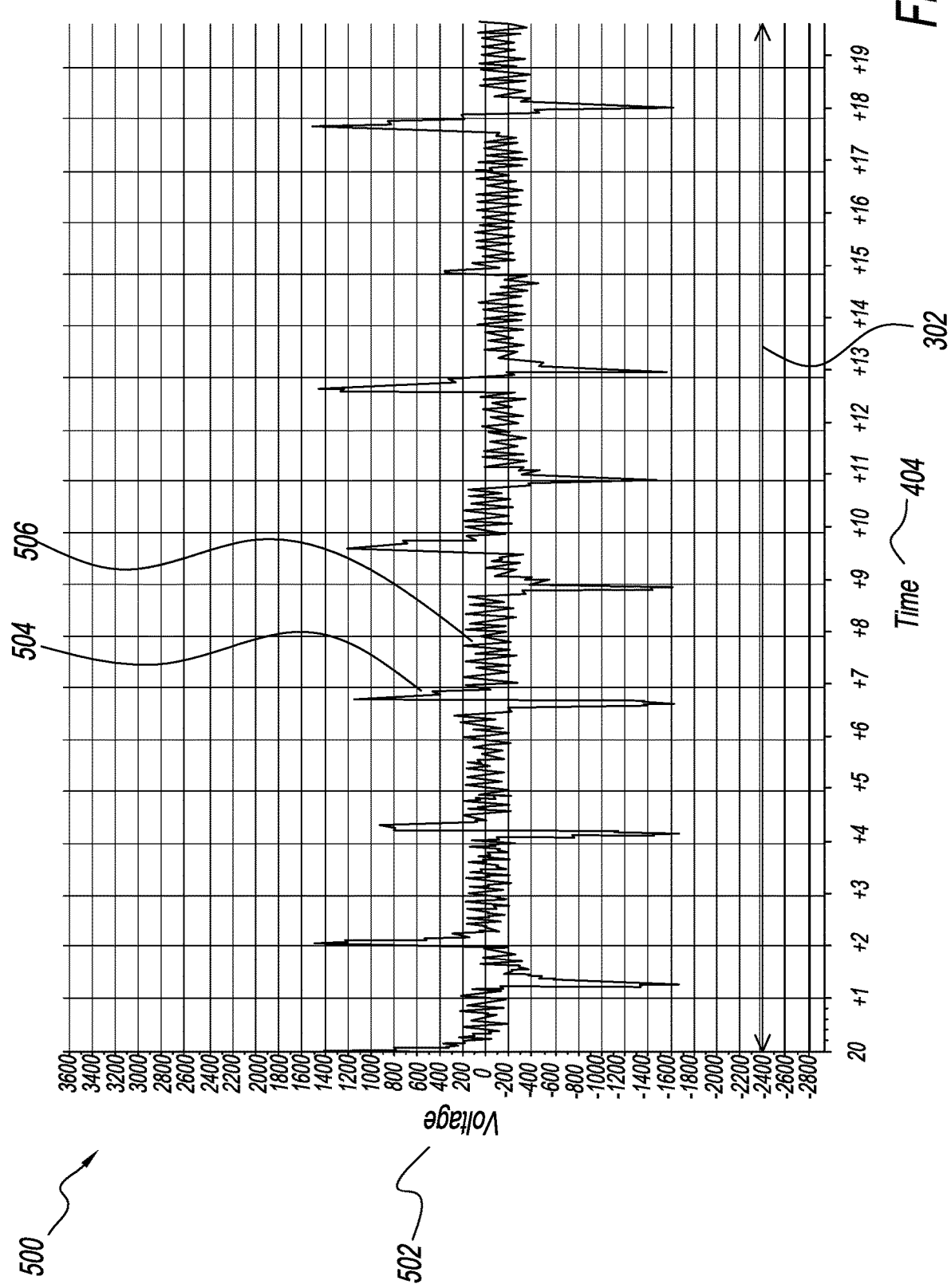
FIG. 5 is a DSP controller output showing a bulbar ripple voltage wave form.

FIG. 5 shows a voltage trace 500 across a section of busbar. Voltage 502 is shown versus time 404 over a reference period 302. Similar to FIG. 4, the units of voltage are bits from an A/D converter. Each bit corresponds to about 3.6 microvolts. The inductive effects, such as overshoot 504, dominate the signal. Noise 506 is also a strong factor. Nonetheless, the DSP is able to measure a busbar restive impedance of 0.026 milliohms and a phase shift of 29.5 degrees.

CONCLUSION

While the disclosure has been described with reference to one or more different exemplary embodiments, it will be understood by those skilled in the art that various changes may be made and equivalents may be substituted for elements thereof without departing from the scope of the disclosure. In addition, many modifications may be made to adapt to a particular situation without departing from the essential scope or teachings thereof. Therefore, it is intended that the disclosure not be limited to the particular embodiment disclosed as the best mode contemplated for carrying out this invention.

We claim:

1. A battery monitor control system comprising:
   a) a load plate comprising:
      1) one or more primary switches adapted to be connected to two or more terminals of a string of one or more battery units connected in series;
      2) a load resistor $R_L$ in series with said one or more primary switches; and
      3) a current sensor in series with said one or more primary switches;
   b) two or more lead wires adapted to be connected to two or more busbars electrically connecting said battery units in said string;
   c) a digital signal processor adapted to:
      1) control said one or more primary switches to produce a ripple current through said string of battery units, said ripple current having a ripple current wave form comprising a reference frequency;
      2) measure a ripple voltage wave form across each of said battery units via said lead wires;
      3) measure said ripple current wave form from said current sensor;
      4) determine a real portion of a complex impedance of each of said battery units using said measured ripple voltage wave forms and said measured ripple current wave forms; and
      5) output said real portion of said complex impedance of each of said battery units such that changes in said real portion of said complex impedance of each battery unit can be tracked over time
   d) said primary switches are controlled by a pulse width modulated sine wave
   e) said primary switches are turned on and off at a modulation frequency that is in the range of 4 to 16 times said reference frequency; and
   f) the pulse width between when said primary switches are turned on and off is modulated by a sine wave.

2. The battery monitor control system of claim 1 wherein said reference frequency is in the range of 40 Hz to 70 Hz.

3. The battery monitor control system of claim 1 wherein the modulation frequency is about 8 times the reference frequency.

4. The battery monitor control system of claim 1 wherein at least one of said one or more primary switches comprises an insulated gate bipolar transistor.

5. The battery monitor control system of claim 1 wherein:
   a) a data sampling rate of said wave forms by said digital signal processor is at least 48 kHz; and
   b) said measurement of said wave forms is for a period of at least 36 periods of said reference frequency.

6. The battery monitor control system of claim 1 wherein said battery unit is either:
   a) a cell;
   b) a jar; or
   c) a monobloc.

7. The battery monitor control system of claim 1 wherein said bulbar comprises:
   a) a solid bar;
   b) a cable; or
   c) a flexible wire.

8. The battery monitor control system of claim 1 that further comprises:
   a) said string of one or more battery units connected in series;
   b) said two or more terminals of said string of one or more battery units connected in series; and
   c) said two or more busbars electrically connecting said battery units in said string
   wherein:
   d) said one or more primary switches are connected to said two or more terminals of said string of one or more battery units connected in series; and
   e) said two or more lead wires are connected to said two or more busbars electrically connecting said battery units in said string.

9. The battery monitor control system of claim 1 wherein:
   a) at least one of said battery units is a VRLA battery; and
   b) said load resistor $R_L$ is selected such that the amplitude of said ripple current is 20 amps or greater.

* * * * *

UNITED STATES PATENT AND TRADEMARK OFFICE
CERTIFICATE OF CORRECTION

PATENT NO. : 10,705,128 B2
APPLICATION NO. : 16/619975
DATED : July 7, 2020
INVENTOR(S) : Edward M. Potempa and Allan J. Baum, Jr.

Page 1 of 1

It is certified that error appears in the above-identified patent and that said Letters Patent is hereby corrected as shown below:

In the Claims
1) Column 7, the word --wherein:-- should be inserted between Lines 31 and 32 of Claim 1;
2) Column 7 on Lines 32, 35 and 37, sections "d)", "e)", and "f)" should align with sections "a)", "b)" and "c)" recited earlier in Claim 1; and
3) Column 7 on Line 33 of Claim 1 reads "said primary switches are controlled by a pulse width modulated sine wave". It should be changed to "said primary switches are controlled by a pulse width modulated sine wave;".

Signed and Sealed this
Eighteenth Day of August, 2020

Andrei Iancu
*Director of the United States Patent and Trademark Office*